(12) United States Patent
Yu

(10) Patent No.: US 7,676,277 B2
(45) Date of Patent: Mar. 9, 2010

(54) DATA RECEIVING APPARATUS AND CONTROL METHOD THEREOF

(75) Inventor: Gyeong-ho Yu, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 973 days.

(21) Appl. No.: 11/259,126

(22) Filed: Oct. 27, 2005

(65) Prior Publication Data
US 2006/0104135 A1    May 18, 2006

(30) Foreign Application Priority Data
Nov. 16, 2004   (KR) ...................... 10-2004-0093686

(51) Int. Cl.
*G06F 19/00* (2006.01)
(52) U.S. Cl. ............... 700/1; 710/62; 345/536
(58) Field of Classification Search ...................... 700/1; 710/62; 370/389, 796; 455/463; 714/25, 714/43; 345/531, 536
See application file for complete search history.

(56) References Cited
U.S. PATENT DOCUMENTS
4,968,902 A    11/1990   Jackson

| | | | |
|---|---|---|---|
| 6,704,371 B1 | 3/2004 | Hishiki et al. | |
| 6,769,078 B2* | 7/2004 | Barenys et al. | 714/43 |
| 2005/0251594 A1* | 11/2005 | Voth et al. | 710/62 |
| 2005/0262395 A1* | 11/2005 | Yang et al. | 714/25 |
| 2007/0070251 A1* | 3/2007 | White et al. | 348/607 |

FOREIGN PATENT DOCUMENTS

| | | |
|---|---|---|
| KR | 1999-0038788 A | 6/1999 |
| KR | 2001-0023970 A | 3/2001 |
| KR | 2002-0040796 A | 5/2002 |
| KR | 10-2004-0066618 A | 7/2004 |
| KR | 10-2004-0094194 A | 11/2004 |

* cited by examiner

*Primary Examiner*—Kidest Bahta
(74) *Attorney, Agent, or Firm*—Sughrue Mion, PLLC

(57) ABSTRACT

A data receiving apparatus and control method are provided. The apparatus includes a determining part determining whether a clock signal and a data signal are respectively in a high state and/or in a low state based on a predetermined value of a standard level, when the clock signal and the data signal are received from an external apparatus; and a controller determining a data communicating state corresponding to the high state and/or the low state of the clock signal and the data signal determined in the determining part.

12 Claims, 5 Drawing Sheets

DATA RECEIVING APPARATUS AND CONTROL METHOD THEREOF

CROSS-REFERENCE TO RELATED APPLICATIONS

This application claims priority from Korean Patent Application No. 10-2004-0093686, filed on Nov. 16, 2004, in the Korean Intellectual Property Office, the disclosure of which is incorporated herein by reference.

BACKGROUND OF THE INVENTION

1. Field of the Invention

Apparatuses and methods consistent with the present invention relate to a data receiving apparatus and control method thereof, and more particularly, to a data receiving apparatus and control method thereof communicating through an I²C (Inter-Integrated Circuit) bus.

2. Description of the Related Art

Generally, a data receiving apparatus, of the type which receives data such as a video signal, an audio signal, etc., communicates through an I²C (bus, a UART (universal asynchronous receiver transmitter) bus, or the like to exchange data.

I²C communication, which utilizes an I²C bus to communicate between devices, includes a clock signal and a data signal line. For example, I²C communication may be used to send and receive information between a CPU, a memory, and an I/O device. Further, I²C communication uses a two-line serial bus, where one line is for sending/receiving the clock signal and the other is for the data signal.

As a consequence of using only two lines, I²C communication provides for a simplified configuration of the data receiving apparatus. In addition, the communication method between devices may also be simplified. As a result I²C communication is widely used.

For example, an I²C communication method where communication between devices occurs through signal transmission using the clock signal line and the data signal line may be set up as shown in Table 1.

TABLE 1

| start | slave address type of IC | ACK acknowledge | sub-address kind of function | ACK acknowledge | data | ACK acknowledge | stop |
|---|---|---|---|---|---|---|---|
| | 8 bit | 1 bit | 8 bit | 1 bit | 8 bit | 1 bit | |

Each line of the I²C bus may be connected to a plurality of devices. When a user controls the plurality of devices, the data receiving apparatus may read and store the data into the devices as in the following process. A controller which controls the devices outputs a start signal to the I²C bus. Further, the controller outputs a slave address to the I²C bus. The slave address may be predetermined for each device, so that each device to be controlled by the controller is identified by a corresponding slave address. The device which is identified by the slave address may be on standby when the slave address is received. The device outputs an acknowledge (ACK) signal to the I²C bus. The ACK signal informs that the device identified by the slave address has normally received the signal from the controller. The sub-addresses correspond to functions which are predetermined in the devices. In addition, the devices may communicate with other devices through the I²C bus. The controller outputs the sub-address to a device which is on standby. When the device receives the sub-address, the device outputs the ACK signal and the data signal through the I²C bus. The device outputs the ACK signal again after the data signal. Then, the controller outputs a stop signal to inform the device of the end of the I²C communication.

During I²C communication the start signal, the stop signal, etc. are classified according to the following method.

TABLE 2

| | start | stop | ACK | data |
|---|---|---|---|---|
| Clock signal | High | High | ↑ | ↑ |
| Data signal | ↓ | ↑ | Low | Low: 0, High: 1 |

For example, five volts (5V) indicates the high state of the clock signal and the data signal, respectively. Further, zero volts (0V) indicates that the clock signal and the data signal are respectively in a low state. When the state of the clock signal is high, if the data signal in the high state transitions to the low state data signal, the devices communicating through the I²C bus recognize the signals as the start signal.

When the state of the clock signal is high, if the data signal in the low state transitions to the high state data signal, the devices communicating through the I²C bus recognize the signals as the stop signal. When the state of the data signal is low, if the clock signal in the low state transitions to the high state clock signal, the devices recognize the data as 0. When the state of the data signal is high, if the clock signal in the low state transitions to the high state clock signal, the devices recognize the data as 1.

However, when both the clock signal and the data signal are lower than 5V and higher than 0V, the clock signal and the data signal are not in the high and low state. In this case, the clock signal and the data signal may respectively be represented in the manner of table 2 such as ↑ ↑, ↑ ↓, ↓ ↑, ↓ ↓.

However, ↑ ↑, ↑ ↓, ↓ ↑, ↓↓ do not correspond to a state described in table 2, so that the devices communicating through the I²C bus recognize the clock/data signals as an error.

In other words, the device communicating through the I²C bus sends and/or receives a plurality of signals through each line. When the input states of the clock signal and data signal are converted almost at the same time, each of the clock signal and the data signal may not to be in the high state and the low state so that an error may occur. Further, in the case where a data receiving apparatus which includes an HDCP (high-bandwidth digital content protection) function receives signals through the I²C bus which are not in a high state or low state, and the signals may not be processed properly.

SUMMARY OF THE INVENTION

Accordingly, it is an aspect of the present invention to provide a data receiving apparatus which reduces errors which occur an I²C communication.

According to an aspect of the present invention, there is provided a data receiving apparatus comprising: a determining unit which determines whether a clock signal and a data signal are respectively in a high state and/or in a low state based on a predetermined value of a standard level, when the clock signal and the data signal are received from an external apparatus; and a controller which determines a data communicating state corresponding to the high state and/or the low state of the clock signal and the data signal which is determined in the determining part.

According to an aspect of the invention, the apparatus may further comprise a memory storing at least one value for the standard level, wherein the controller controls the predetermined value of the standard level in the determining part based on the value which is stored in the memory for the standard level.

According to an aspect of the invention, the clock signal and the data signal are input through an I$^2$C bus.

According to an aspect of the invention, the apparatus may further comprise a certifying part which outputs a first certifying key, wherein the data signal comprises a second certifying key, and the controller determines whether the first certifying key is identical to the second certifying key based on the data communicating state of the clock signal and the data signal, outputs the first certifying key to the external apparatus and receives a video signal from the external apparatus when the first certifying key is identical to the second certifying key.

According to an aspect of the invention, the first certifying key is periodically renewed.

According to an aspect of the present invention, there is provided a control method of a data receiving apparatus comprising: receiving a clock signal and a data signal; determining whether the clock signal and the data signal are respectively in a high state and/or in a low state based on a predetermined value of a standard level; determining a data communicating state which corresponds to the high state and/or the low state of the clock signal and the data signal.

According to an aspect of the invention, the method may further comprise controlling the predetermined value of the standard level.

According to an aspect of the invention, the method may further comprise comparing the first certifying key provided in the data receiving apparatus with the second certifying key provided in the data signal, and receiving a video signal from an external apparatus when the first certifying key is identical to the second certifying key.

According to an aspect of the invention, the method may further comprise comparing the first certifying key provided in the data receiving apparatus with the second certifying key provided in the data signal, and receiving a video signal from an external apparatus when the first certifying key corresponds to the second certifying key.

BRIEF DESCRIPTION OF THE DRAWINGS

These and other aspects of the present invention general inventive concept will become apparent and more readily appreciated from the following description of the exemplary embodiments, taken in conjunction with the accompanying drawings of which.

DETAIL DESCRIPTION OF THE EXEMPLARY EMBODIMENTS OF THE INVENTION

Figure 1:
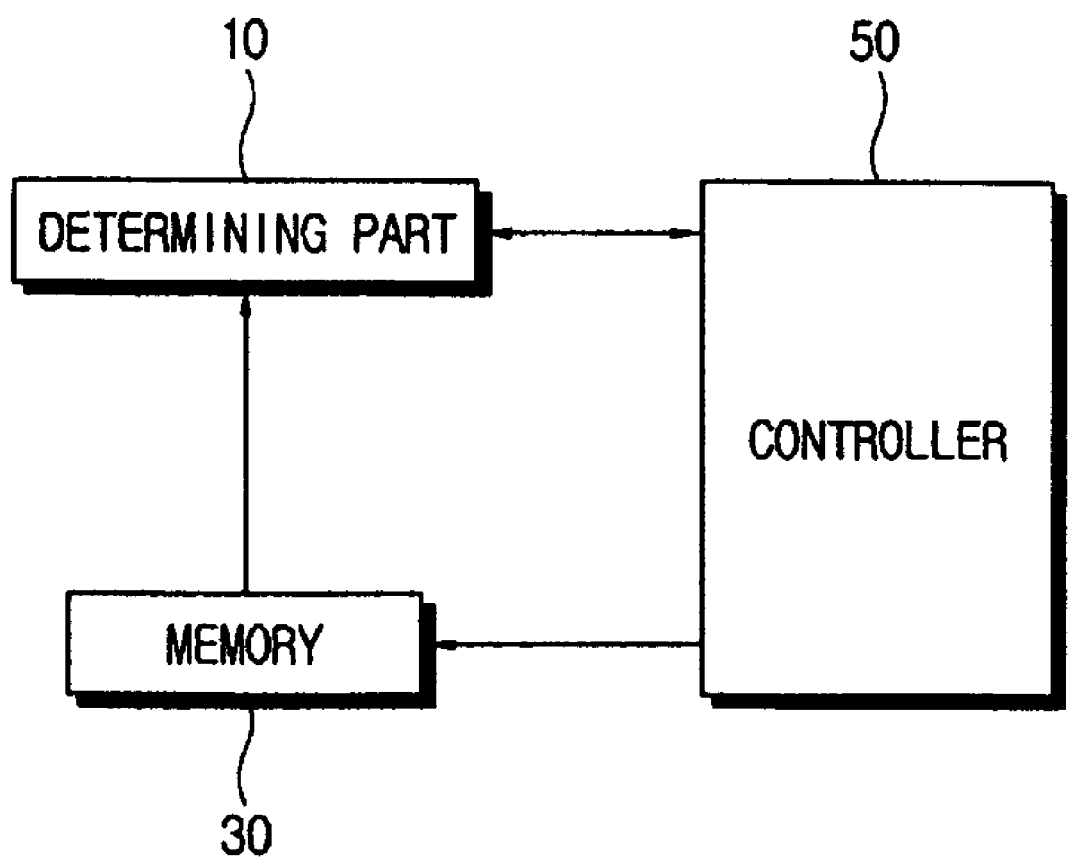
FIG. 1 is a control block diagram of a data receiving apparatus according to an exemplary embodiment of the present invention.

Reference will now be made in detail to the exemplary embodiments of the present invention, examples of which are illustrated in the accompanying drawings, wherein like reference numerals refer to like elements throughout.

As shown in FIG. 1, a data receiving apparatus according to an exemplary embodiment of the present invention comprises a determining part 10 which determines an input state (i.e., a high state and low state) of an input signal based on a standard level which has a predetermined value, wherein the predetermined value is lower than maximized voltage of a clock signal and a data signal and higher than minimized voltage of the clock signal and the data signals; a memory 30 which stores at least one value for the standard level; a controller 50 which controls the predetermined value of the standard level in the determining part 10 based on the value for the standard level stored in the memory 30.

The determining part 10 determines the input state of the data signal and the clock signal, when the clock signal and the data signal are input through an I$^2$C bus. The determining part 10 outputs a high signal when the voltage of the clock signal is higher than the value of the standard level, and outputs a low signal when the voltage of the clock signal is lower than the value of the standard level. Also, the determining part 10 outputs a high signal when the voltage of the data signal is higher than the value of the standard level, and outputs a low signal when the voltage of the data signal is lower than the value of the standard level. The determining part 10 may be implemented as a latch.

The memory 30 may comprise at least one value for the standard level. The memory 30 may also comprise command data to control the value of the standard level. The memory 30 may be provided as a register, but is not limited to a register. Alternatively, the memory 30 may be provided as various devices as long as the devices store the standard level.

The controller 50 determines a data communication state which corresponds to a combination of the input states of the clock signal and the data signal which are input from the determining part 10, so that the controller 50 performs operations based on the data communication state.

The controller 50 may input the value for the standard level stored in memory 30 into the determining part 10. Then, the predetermined value of the standard level in determining part 10 is converted into the value which is output from the memory 30.

When a user changes the predetermined value of the standard level into an A-value, in which the predetermined value is changed, the controller 50 may output the A-value for the standard level stored in the memory 30 into the determining part 10. Thus, the controller 50 controls the determining part 10 to determine the data communication state based on the renewed A-value of the standard level inputted thereto. Accordingly, the determining part 10 determines the input state of the clock signal and the data signal based on the A-value as the standard level. Specifically, the voltage of the inputted clock signal is higher than the A-value, the input state thereof is determined to be in the high state, and the voltage thereof is lower than the A-value, the input state thereof is determined to be in the low state. The data signal is applied the same as the clock signal.

Figure 2:
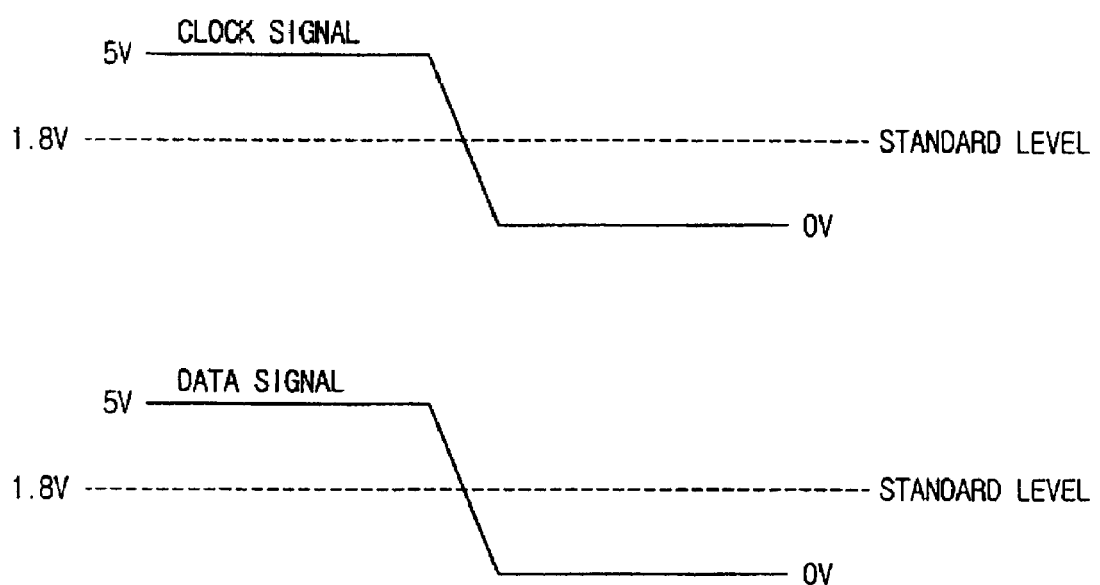
FIG. 2 illustrates a waveform of a clock signal and a data signal according to an exemplary embodiment of the present invention.

As shown in FIG. 2, the description will be given as the state where the maximized value of the clock signal and the data signal are 5V and the minimized value thereof are 0V, by way of example. Herein, the 5V signal is in the high state and the 0V signal is in the low state. Further the value of the standard level may be predetermined as 1.8V in the determining part 10. Accordingly, the determining part 10 may determine that the input signal is in the high state when the input signal is higher than 1.8V, and determine that the input signal is in the low state when the input signal is lower than 1.8V.

Referring to FIG. 2, a high state and low state of the voltages of the clock signal and the data signal are 5V and 0V, respectively. However, if the respective clock signal and data signal are not in the high state and in the low state, an error may occur as a result. In contrast, the data receiving apparatus according to an aspect of the present invention comprises the predetermined value of the standard level, which is lower than 5V and higher than 0V. Thus, the data receiving apparatus according to an aspect of the present invention recognizes the high/low state of the input signals based on the predetermined value of the standard level so that the error may be corrected.

Figure 3:
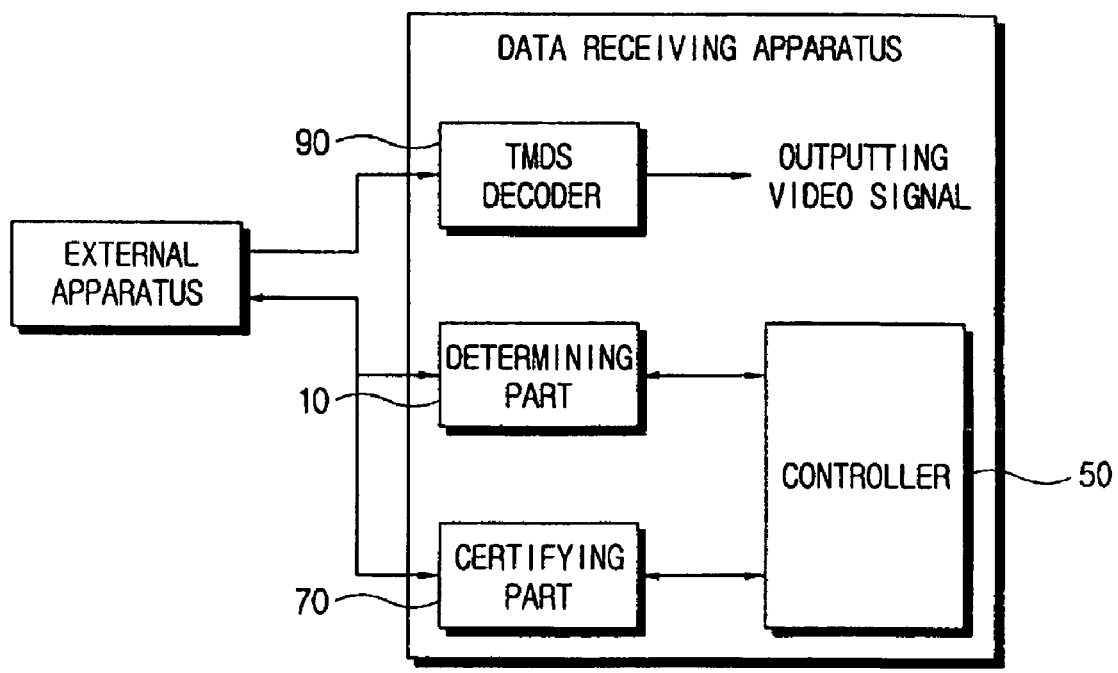
FIG. 3 is a control block diagram of a data receiving apparatus having an HDCP function according to an exemplary embodiment of present invention.

As shown in FIG. 3, when a data receiving apparatus which includes an HDCP function uses a digital video interface (DVI) to send/receive a digital signal, the data receiving apparatus receives an encoded video signal from an external apparatus such as a PC, a set-top box, etc.

The data receiving apparatus comprises a determining part 10 which determines an input state of a clock signal and a data signal input thereto; a certifying part 70 which certifies the inputted data signal based on a combination of the input states which are determined through the determining part 10; a TMDS decoder 90 which decodes the digital clock signal and data signal from the external apparatus when the clock signal and the data signal are normally certified.

The certifying part 70 comprises a first certifying key for certifying the inputted data signal. When the external apparatus outputs a second certifying key to the data receiving apparatus through an I²C bus, the data receiving apparatus determines the data signal comprising the second certifying key. When the second certifying key is identical to the first certifying key in the data receiving apparatus, the certifying part 70 normally certifies the data signal. After the data signal is normally certified, the data receiving apparatus outputs the first certifying key to the external apparatus. Thus, the external apparatus outputs the encoded video signal to the data receiving apparatus. When the first certifying key and the second certifying key are not identical each other, the data receiving apparatus determines that the data signal is not certified, so that the data receiving apparatus does not receive the data signal from the external apparatus.

As described above, the determining part 10 determines whether values of the clock signal and the data signal are higher and/or lower than a predetermined value of a standard level to determine the input state of the clock signal and the data signal.

The certifying part 70 comprises a plurality of first certifying keys. When the first certifying key is identical to the second certifying key so that the data signal is certified, the data receiving apparatus outputs the first certifying key to the external apparatus. In addition, the certifying part 70 may output the first certifying key corresponding to the second certifying key to the external apparatus. The first certifying key may be renewed. A plurality of first certifying keys stored in the certifying part 70 may be periodically renewed.

The controller 50 determines a data communication state based on a combination of the respective input states of the clock signal and the data signal which is determined in the determining part 10. The controller 50 determines the second certifying key based on the combination of the input state determined in the determining part 10. When the controller 50 compares the first certifying key and the second certifying key and determines that both keys are identical each other, the controller 50 controls the certifying part 70 to output the first certifying key to the external apparatus. Thus, the external apparatus outputs the video signal to the TMDS decoder 90 of the data receiving apparatus.

The TMDS decoder 90 decodes the encoded video signal which is input through a TMDS line. For example, the TMDS decoder 90 converts the encoded video signal into a digital video signal, a H/V sync signal, and the like, then outputs the video signal to a display.

Figure 4:
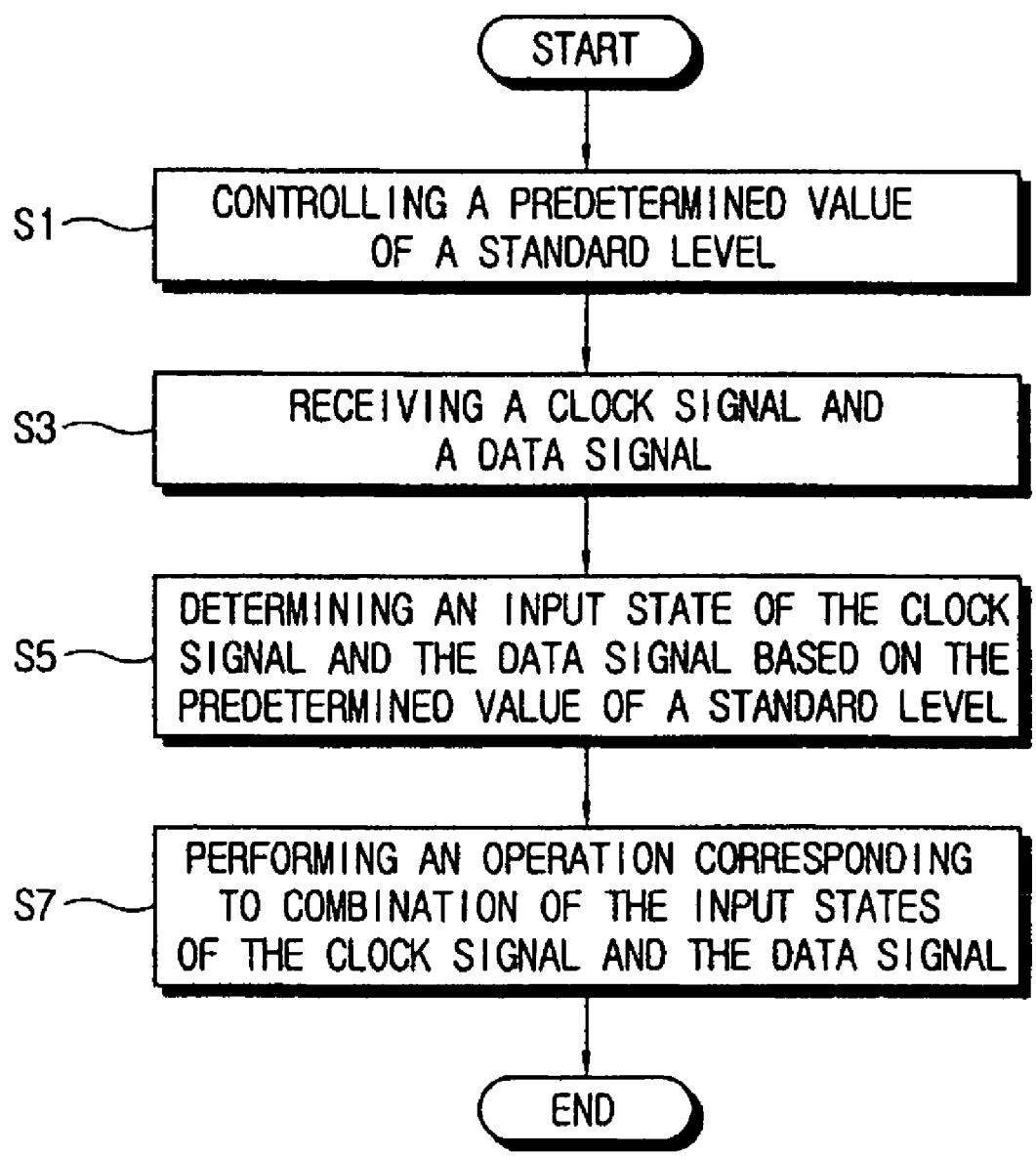
FIG. 4 is a flow chart of a data receiving apparatus according to an exemplary embodiment of the present invention.

As shown in FIG. 4, the predetermined value of the standard level, which is a standard to determine the input states of the input clock signal and the input data signal, may be controlled in the data receiving apparatus according to an exemplary embodiment of the present invention at operation S1. The controller 50 controls the memory 30 to output the value stored therein into the determining part 10, so that the predetermined value of the standard level in the determining part 10 is converted. When the clock signal and the data signal are input from the external apparatus to the data receiving apparatus at operation S3, the input states of the clock signal and the data signal are respectively determined based on the predetermined value of the standard level. Specifically, when the value of the clock signal is higher than the predetermined value of the standard level, the clock signal is determined to be in the high state, and when the voltage thereof is lower than the predetermine value of the standard level, the clock signal is determined to be in the low state at operation S5. Also, the data signal is applied in the same manner as the clock signal at operation S5. After the input state of the clock signal and the input state of the data signal are determined, the controller 50 determines the data communicating state corresponding to the combination of the input state of the clock signal and the input state of the data signal. In other words, the controller 50 determines whether the communicating state is start, stop, data, and the like. Accordingly, the controller 50 may perform an operation corresponding to the communicating state at operation S7.

Figure 5:
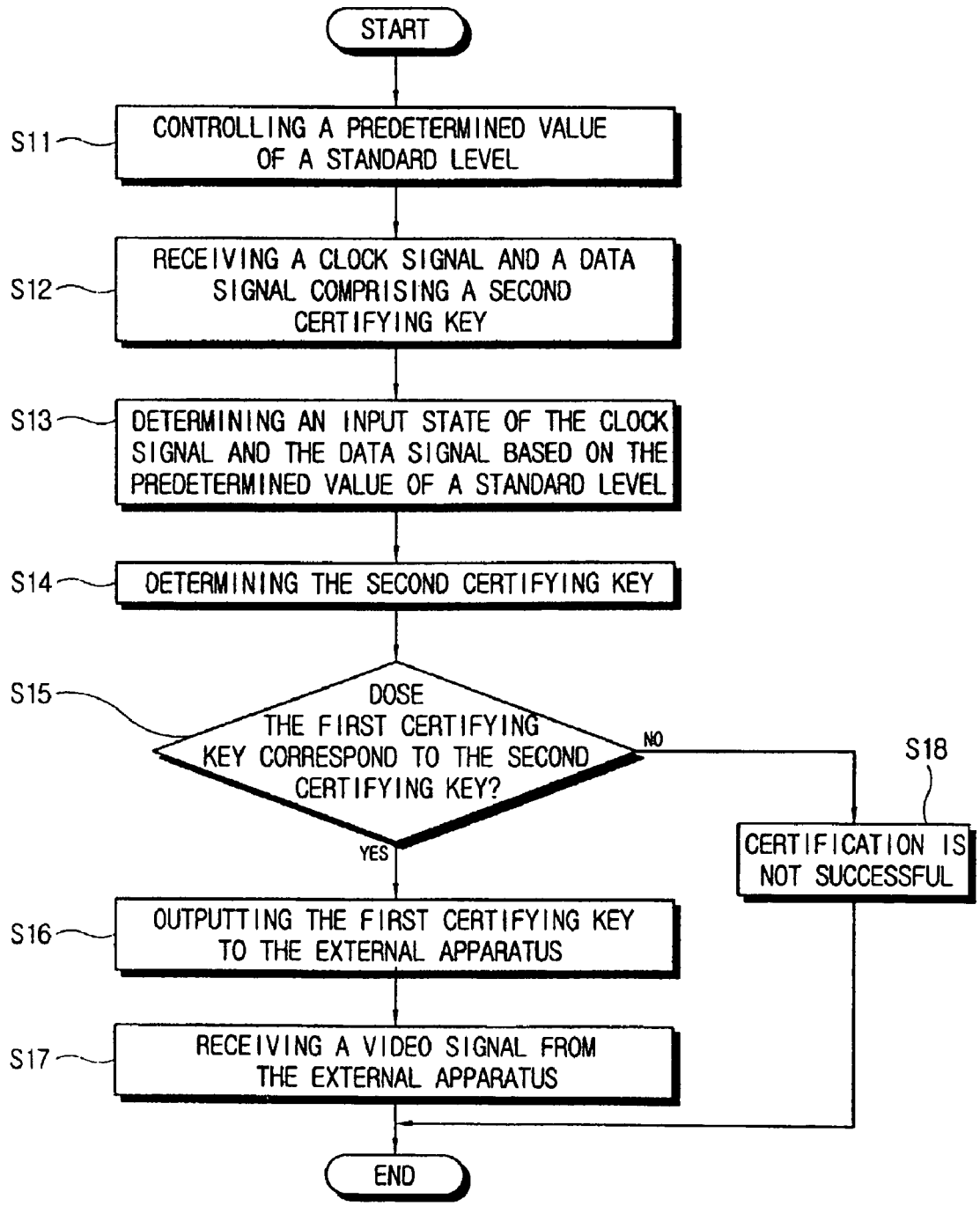
FIG. 5 is a flow chart of a data receiving apparatus having an HDCP function according to an exemplary embodiment of the present invention.

As shown in FIG. 5, the data receiving apparatus which includes the HDCP function may control the predetermined value of the standard level, as in an exemplary embodiment described in FIG. 4, at operation S11. The data receiving apparatus receives the clock signal and the data signal comprising the second certifying key from the external apparatus through the I²C bus at operation S12. When the clock signal and the data signal are inputted to the data receiving apparatus, the determining part 10 determines the input states of the signals, whether each signal is in the high state or in the low state, based on the predetermined value of the standard level at operation S13. Also, the controller 50 determines the data communicating state corresponding to the input state. The data signal comprises the second certifying key so that the controller 50 may determine the second certifying key at operation S14. The controller 50 compares the first certifying key in the certifying part 70 with the second certifying key at operation S15. When the first certifying key and the second certifying key are identical to each other, the controller 50 determines that the certifying is successful. Accordingly, the data receiving apparatus outputs the first certifying key to the external apparatus at operation S16. The external apparatus outputs the encoded video signal to the data receiving apparatus. The data receiving apparatus receives the encoded video signal and displays an image on the display at operation S17. When the first certifying key is not identical to the second certifying apparatus, the certification is not successful, so that the data receiving apparatus does not output the first certifying key to the external apparatus, and does not receive the video signal from the external apparatus at operation S18.

When a conventional data receiving apparatus receives the plurality of the signals through the I²C bus, the input state of the clock signal and the input state of the data signal are converted almost at the same time between in the high state and in the low state. Accordingly, the determining part 10 may not determine whether the signals are in the high state and/or in the low state. When both of the clock signal and the data signal are not in the high state and in the low state, the data receiving apparatus may not determine the input state and the data communicating state thereof, so that an error may occur.

However, as described above, the data receiving apparatus according to an exemplary embodiment of the present invention determines the input state, i.e. the high state and the low state, based on the predetermined value of the standard level, so that the error may be corrected. Specifically, the data receiving apparatus having the HDCP function receives the plurality of the signals through the I²C bus, so that the error may be effectively corrected in the data receiving apparatus having the HDCP function.

Although exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A data receiving apparatus comprising:
   a determining unit which determines whether a clock signal and a data signal, which are received from an external apparatus, are respectively in a high state or in a low state based on a predetermined value of a standard level; and
   a controller which determines a data communicating state which corresponds to the high state or the low state of the clock signal and the data signal which is determined in the determining unit,
   wherein the predetermined value of the standard level is lower than a level of the high state and higher than a level of the low state,
   wherein the determining unit determines that the clock signal and the data signal are respectively in the high state if the voltage of the clock signal and the data signal are respectively higher than the predetermined value of the standard level, and
   determines that the clock signal and the data signal are respectively in the low state if the voltage of the clock signal and the voltage of the data signal are respectively lower than the predetermined value of the standard level.

2. The data receiving apparatus according to claim 1, further comprising a memory which stores at least one value for the standard level,
   wherein the controller controls the predetermined value of the standard level in the determining part based on the value which is stored in the memory for the standard level.

3. The data receiving apparatus according to claim 1, wherein the clock signal and the data signal are input through an I²C bus.

4. The data receiving apparatus according to claim 1, further comprising a certifying part which outputs a first certifying key,
   wherein the data signal comprises a second certifying key, and
   the controller determines whether the first certifying key is identical to the second certifying key based on the data communicating state of the clock signal and the data signal, outputs the first certifying key to an external apparatus and receives a video signal from the external apparatus if the first certifying key is identical to the second certifying key.

5. The data receiving apparatus according to claim 4, wherein the first certifying key is periodically renewed.

6. The data receiving apparatus according to claim 2, wherein the clock signal and the data signal are inputted through an I²C bus.

7. The data receiving apparatus according to claim 2, further comprising a certifying part which outputs a first certifying key,
   wherein the data signal comprises a second certifying key, and
   the controller determines whether the first certifying key is identical to the second certifying key based on the data communicating state of the clock signal and the data signal, outputs the first certifying key to an external apparatus and receives a video signal from the external apparatus if the first certifying key is identical to the second certifying key.

8. The data receiving apparatus according to claim 7, wherein the first certifying key is periodically renewed.

9. A method for controlling a data receiving apparatus, the method comprising:
   receiving a clock signal and a data signal at the data receiving apparatus;
   determining whether the clock signal and the data signal are respectively in a high state or in a low state based on a predetermined value of a standard level;
   determining a data communicating state which corresponds to the high state or the low state of the clock signal and the data signal,
   wherein the predetermined value of the standard level is lower than a level of the high state and higher than a level of the low state,
   wherein the determining whether the clock signal and the data signal are respectively in the high state or the low state comprises determining that the clock signal and the data signal are respectively in the high state if the voltage of the clock signal and the voltage of the data signal are respectively higher than the predetermined value of the standard level, and
   determining that the clock signal and the data signal are respectively in the low state if the voltage of the clock signal and the voltage of the data signal are respectively lower than the predetermined value of the standard level.

10. The method of claim 9, further comprising controlling the predetermined value of the standard level.

11. The method of claim 9, further comprising comparing a first certifying key which is provided in the data receiving apparatus with a second certifying key which is provided in the data signal, and receiving a video signal from an external apparatus if the first certifying key is identical to the second certifying key.

12. The method of claim 10, further comprising comparing a first certifying key which is provided in the data receiving apparatus with a second certifying key which is provided in the data signal, and receiving a video signal from an external apparatus if the first certifying key corresponds to the second certifying key.

* * * * *